(12) United States Patent
Ohata

(10) Patent No.: US 7,897,272 B2
(45) Date of Patent: Mar. 1, 2011

(54) WEAR-RESISTANT STRUCTURE

(75) Inventor: Hiroshi Ohata, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 739 days.

(21) Appl. No.: 11/553,442

(22) Filed: Oct. 26, 2006

(65) Prior Publication Data

US 2007/0092761 A1    Apr. 26, 2007

(30) Foreign Application Priority Data

Oct. 26, 2005    (JP)    ............................ P2005-311767

(51) Int. Cl.
*B32B 9/00*    (2006.01)
(52) U.S. Cl. .................. 428/698; 428/697; 428/699
(58) Field of Classification Search .................. 428/698, 428/697, 699
See application file for complete search history.

(56) References Cited

U.S. PATENT DOCUMENTS 7,217,466 B2 *    5/2007    Weber et al. ................. 428/698

FOREIGN PATENT DOCUMENTS

JP    06-248420    9/1994

* cited by examiner

*Primary Examiner*—Archene Turner
(74) *Attorney, Agent, or Firm*—DLA Piper LLP (US)

(57) ABSTRACT

There is provided a surface-coated body equipped with a hard film that has high adherence and exerts excellent wear resistance. In a surface-coated body in which the surface of a base body is coated with at least one layer of a hard film constituted of one or more of nitride, nitrooxide, carbonitride and carbonitrooxide including at least Ti and Al, the hard film contains 0.01-1% by mass of one or more inert gas elements selected from He, Ne, Ar, Xe, Kr and Rn based on the total mass of the hard film, and, among peaks detected with the X-ray diffraction method for the hard film, the peak caused by the (111) plane of the crystal has the highest intensity.

7 Claims, 4 Drawing Sheets

WEAR-RESISTANT STRUCTURE

BACKGROUND OF THE INVENTION

1. Field of the Invention

The present invention relates to a wear-resistant structure in which a surface of a base body is coated with a film constituted of at least one or more of nitride, nitrooxide, carbonitride, and carbonitrooxide that contain titanium.

2. Description of the Related Art

Conventionally, in order to improve wear resistance and fracture resistance of metal cutting tools, a technique of coating a surface of a base body with a hard film of TiC, TiN, TiCN or the like that is harder than the base body by physical vapor deposition (PVD) or chemical vapor deposition (CVD) has been generally used widely.

In addition, recently, as well as the increase of request for high speed machining or high feed machining in order to reduce machining cost, for hard-to-cut materials such as stainless steel and nickel-based alloy has been required. In particular, as a hard film for PVD coated tools, which is excellent in the balance of fracture resistance and wear resistance and the use amount of which is increasing year by year, the most prevailing TiN or TiC films, and further a Ti(C,N) film, a (Ti, Al)N film, and the like film are commercialized.

With respect to such a hard film for use in cutting tools, the present applicant proposed in Japanese Unexamined Patent Publication JP-A 6-248420 (1994) that, in a surface-coated body constituted by coating the surface of a base body with a hard film formed of at least one or more selected from metal carbide, nitride and oxide, a hard film having high hardness and excellent adhesiveness with a base body can be manufactured by containing 0.01-25% by atom of at least one or more inert gas elements selected from He, Ne, Ar, Kr and Xe in the hard film to create a high residual compression stress to the surface of the film.

Although the method in which a predetermined volume of inert gas component is added in film forming can enhance the hardness of the hard film to improve the wear resistance of the film, the fracture resistance of the film was insufficient. For example, in a case of using the film for a cutting tool, the cutting edge part of the hard film suffers from chipping or fractures caused therein from the early period of cutting, resulting in deterioration in accuracy of a machined surface, or poor sliding properties cause troubles in the cutting.

SUMMARY OF THE INVENTION

In a first representative aspect of the invention, a wear-resistant structure comprises a base body and a film formed on the base body. The film contains at least one or more selected from nitride, nitrooxide, carbonitride, and carbonitrooxide that contain at least titanium. The film contains 0.01-1% by mass of one or more selected from He, Ne, Ar, Xe, Kr and Rn based on a total mass of the film. The film shows the maximum intensity at the peak caused by the (111) plane among peaks detected by the X-ray diffraction method.

Further, in another aspect of the invention, a method of manufacturing the wear-resistant structure includes the following constitutions. The method comprises the steps of preparing a base body and forming a film on the base body. The film contains one or more selected from nitride, nitrooxide, carbonitride, and carbonitrooxide that contain at least titanium. Further, the film contains 0.01-1% by mass of one or more selected from He, Ne, Ar, Xe, Kr and Rn based on a total mass of the film. Furthermore, the film shows a maximum intensity at a peak caused by a (111) plane of a crystal among peaks detected by an X-ray diffraction method.

The step of forming the film on the base body is carried out by applying a bias voltage of 10 to 300 V at a temperature of 500 to 600° C. in a mixed gas atmosphere containing nitrogen and one or more inert gasses selected from He, Ne, Ar, Xe, Kr and Rn at a flow rate ratio of 2:1 to 30:1.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
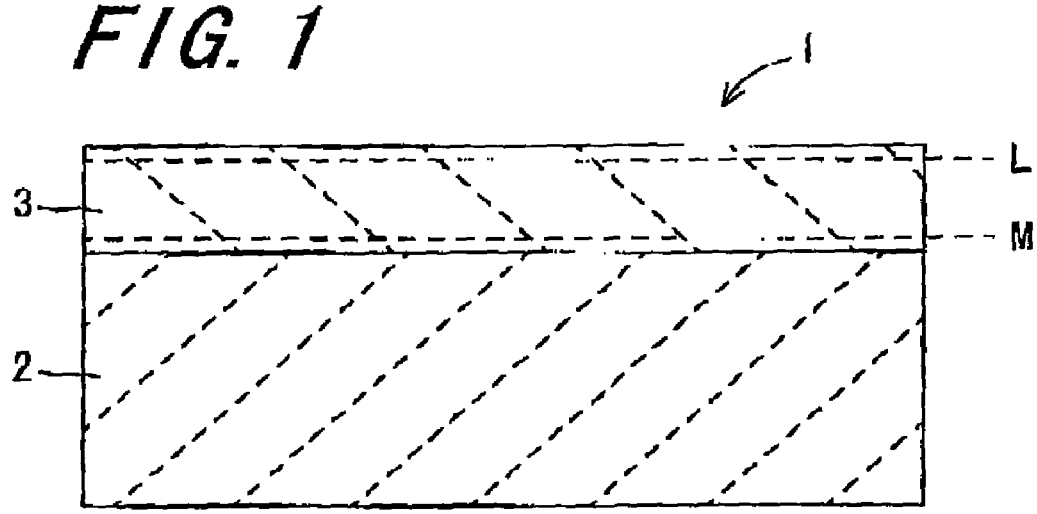
FIG. 1 is a partially sectional view schematically showing a constitution of a wear-resistant structure (coated cutting tool) according to one embodiment of the invention.

Now referring to the drawings, preferred embodiments of the invention are described below.

Hereinafter will be described a case where a wear-resistant structure of the invention constructed by coating a surface of a base body with a hard film (hereinafter referred to as "a surface-coated body") is applied to a cutting tool. FIG. 1 is a partially sectional view schematically showing a coated cutting tool (hereinafter, occasionally abbreviated simply as a tool) according to one embodiment of the invention. In a coated cutting tool 1 shown in FIG. 1, the surface of a base body 2 is coated with one layer of a hard film 3 containing one or more selected from nitride, nitrooxide, carbonitride, and carbonitrooxide that contain at least titanium.

The hard film 3 contains 0.01-1% by mass of at least one inert gas element selected from He, Ne, Ar, Xe, Kr and Rn based on the total mass of the hard film 3, and has the maximum intensity at the peak caused by the (111) plane of the crystal among peaks detected with the X ray diffraction method (XRD). This can result in enhancement of the impact resistance of the hard film 3 and improvement of the fracture resistance of the tool 1 since a residual compression stress is exerted on the hard film. Therefore, chipping and tool damage of the film can be prevented.

The amount of the inert gas contained in the hard film 3 is desirably 0.01-1.0% by mass in point of controllability of the crystal growth direction and capability of satisfying both of the hardness and the impact resistance of the hard film, and, particularly, it is desirably in the range of 0.05-0.5% by mass. In the range of 0.01-1.0% by mass, the direction of the hard film is sufficiently controlled. Accordingly there is no fear that the hard film becomes brittle due to gas atoms contained in the hard film, and therefore the hard film has a sufficient mechanical strength. The quantitative determination of the inert gas in the hard film 3 can be effected by an electron probe microanalyzer (EPMA), an X-ray photoelectron spectroscopy (XPS), or an Auger electron spectroscopy (AES).

Further, it is desirable that the peak having the second-highest intensity among peaks detected with the X-ray diffraction method for the hard film 3 is caused by the (200) plane of the crystal, because this can lead to reducing grain size and thereby the sliding properties of the hard film 3 can be enhanced to improve the wear resistance, handling properties for chips and machining accuracy.

Furthermore, by controlling the ratio of the intensity A of the peak caused by the (111) plane and the intensity B of the peak caused by the (200) plane to 1.1<(A/B)<10.0, high hardness can be given without lowering the adhesion of the hard film 3 to improve the wear resistance, which is desirable. When A/B is more than 1.1 and less than 10.0, growth of the hard film is controlled to be on the (111) plane. Accordingly there is no fear that the hard film becomes brittle due to gas atoms contained in the hard film, and therefore the hard film has a sufficient mechanical strength.

In addition, it is desirable to indispensably contain at least one of Ar and Kr in the hard film 3, because the film is more formed into solid solution, specifically the effect of improving the hardness and break strength of the coating film can be obtained. In particular, it is desirable to indispensably contain Kr, because the hardness and film strength of coated film of the hard film 3 is further improved. Furthermore, in addition to the Ar and/or Kr, it is desirable to contain one or more inert gasses elements selected from He and Ne, because the adhesion of the hard film 3 is further enhanced to exert the effect of preventing tool damages such as chipping caused by film peeling and abnormal wear.

Furthermore, a ratio X/Y is preferably in the range of 0.5-1.5, wherein X is the amount of inert gas in the inside position (line L in FIG. 1) from the surface of the hard film 3 in 10% of the film thickness of the hard film 3, and Y is the amount of inert gas in the inside position (line M in FIG. 1) from the interface of the hard film 3 and the base body 2 in 10% of the film thickness of the hard film 3, is. In other words, it is preferred that the ratio X/Y is 0.5-1.5, wherein X is the amount of the inert gas in the position which is interior from the surface of the hard film 3 by a thickness corresponding to 10% of the thickness of the hard film 3, and Y is the amount of the inert gas in the position which is interior from the interface of the hard film 3 and the base body 2 by a thickness corresponding to 10% of the film thickness of the hard film 3. The amounts of the inert gas X and Y are obtained by the AES when the section of the surface-coated body is irradiated at positions of the line L and line M with an electron beam having a spot diameter of 20 to 30 nm, to then measure the elemental composition having a width of several nanometers in a width direction of the hard film 3 from the section. By making the distribution of the inert gas element in the hard film 3 approximately uniform in this way, there is such effect that stable and high adhesion can be given without lowering of the adhesive strength of the hard film 3. When the ratio X/Y is in the range of 0.5 to 1.5, appropriate contents of gas atoms are contained in the hard film 3, and therefore the adhesion between the base body 2 and the hard film 3 is sufficiently high. The particularly desirable range of the ratio X/Y is 0.7-1.2.

It is preferred that the inert gas content gradually decreases from the inside position from the interface of the hard film 3 and the base body 2 in 10% of the film thickness of the hard film 3 toward the interface of the hard film 3 and the base body 2. In other words, it is preferred that the inert gas content gradually decreases from the position which is interior from the interface of the hard film 3 and the base body 2 by a thickness corresponding to 10% of the thickness of the hard film 3 toward the interface of the hard film 3 and the base body 2. It is desirable because, as the result, lowering of the adhesion between the base body 2 and the hard film 3 caused by introducing the inert gas can be prevented and film peeling can be prevented. The inert gas amount at a specified position of the hard film 3 can be measured with EPMA, XPS, or AES that makes measurement of a microscopic region possible from a film cross-section. The measurement is also possible by using a transmission electron microscope (TEM).

Desirably the hard film 3 further contains Al in point of high oxidation resistance and high wear resistance. All of others, use of (Ti, Al)N being a nitride of Ti and Al is desirable because of its excellent wear resistance and fracture resistance and excellent hardness and oxidation resistance at high temperatures.

The thickness of the hard film 3 is preferably determined to 0.1-10 μm, in particular 0.5-5 μm. This gives sufficient wear resistance without deteriorating the adhesion of the film.

The base body 2 is composed of cemented carbide composed of a hard phase including WC as a primary component and a binder phase including Co as a primary component; cermet including carbide, nitride or carbonitride of titanium as a primary component; ceramics including silicon nitride, aluminum oxide, zirconium oxide or the like as a main constituent; super high pressure sintered body that has been super high pressure sintered using polycrystalline diamond or cubic boron nitride as a hard phase, and metal such as Co or Ni or ceramics such as titan nitride or titanium carbide as a binder phase; or metal, alloy or the like.

As mentioned above, the surface-coated body of the invention can be used as a cutting tool having the hard film as a cutting edge. Examples of the cutting tool for turning, for milling tool, and for boring. Specific examples of the turning tool include cutting tools and throwaway tools such as an external machining, an internal machining, a cut-off tool, a grooving tool, a threading tool, and high-precision tool. Specific examples of the milling tool include such as a plane milling cutter, a face milling cutter, a side milling cutter and groove milling cutter, and solid end mill and throwaway end mills such as a roughing end mill and a ballnose end mill. Specific examples of the boring tool include drills such as a twist drill, a throwaway type drill, a core drill, a center hole drill and a micro drill, and a deep hole tool.

In the embodiment, the case where the surface-coated body is applied to cutting tools is described. However, the invention is not limited to this, and is applicable to, for example, various applications such as cutting edges such as an excavating tool, cutlery and slitter, cutting edges, die tools such as dies, wear resistant tools such as a nozzle, other tools such as a throwaway tool, wear resistant parts such as sliding parts and mold, and impact resistant parts. Among these, when it is used as a cutting tool, it can exerts aforementioned excellent effects.

Figure 2:
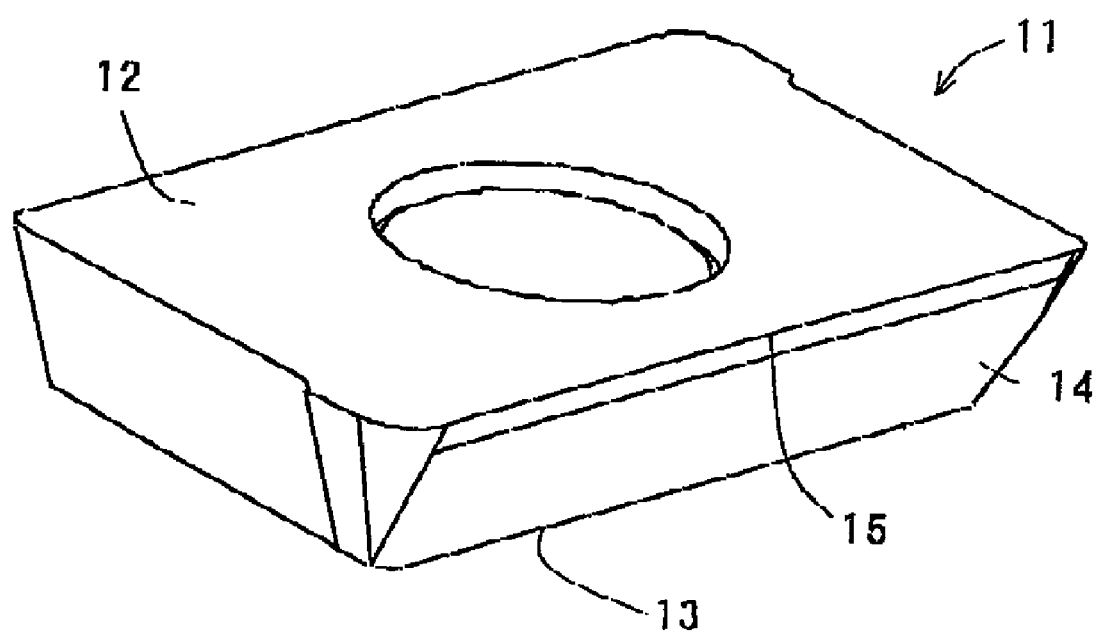
FIG. 2 is a perspective view schematically showing a constitution of an insert for use in a cutting according to one embodiment of the invention.

FIG. 2 is an overall perspective view schematically showing a constitution of a cutting insert 11 for use in a cutting (hereinafter referred to simply as "an insert 11") according to one embodiment of the invention. The insert 11 is attached to a holder (not shown), for example, and used as a milling tool in the cutting. The insert 11 is a platy body having a shape of schematic parallelogram. The insert 11 includes a rake face 12, a seating face 13, a flank 14, and a major cutting edge 15. The rake face 12 is formed on an upper face in a thickness direction of the insert 11 which is vertically placed. The seating face 13 is formed on a lower face in the thickness direction of the insert 11 which is vertically placed. The flank 14 is formed on a side face of the insert 11 which is vertically placed. The major cutting edge 15 is formed on a crossing ridge portion of the rake face 12 and flank 14. A surface of the major cutting edge 15 is formed of the hard film of the surface-coated body of the invention. Furthermore, the major cutting edge 15 has a surface thereof formed of the hard film of the surface-coated body of the invention, and is thus provided with a high wear resistance. Accordingly, even when the insert 11 is used for an overloading cutting such as a heavy cutting, a generation of chatter vibration is prevented so that the cutting is smoothly carried out and moreover, an obtained cut product has significantly enhanced surface smoothness, cutting accuracy, etc.

Figure 3:
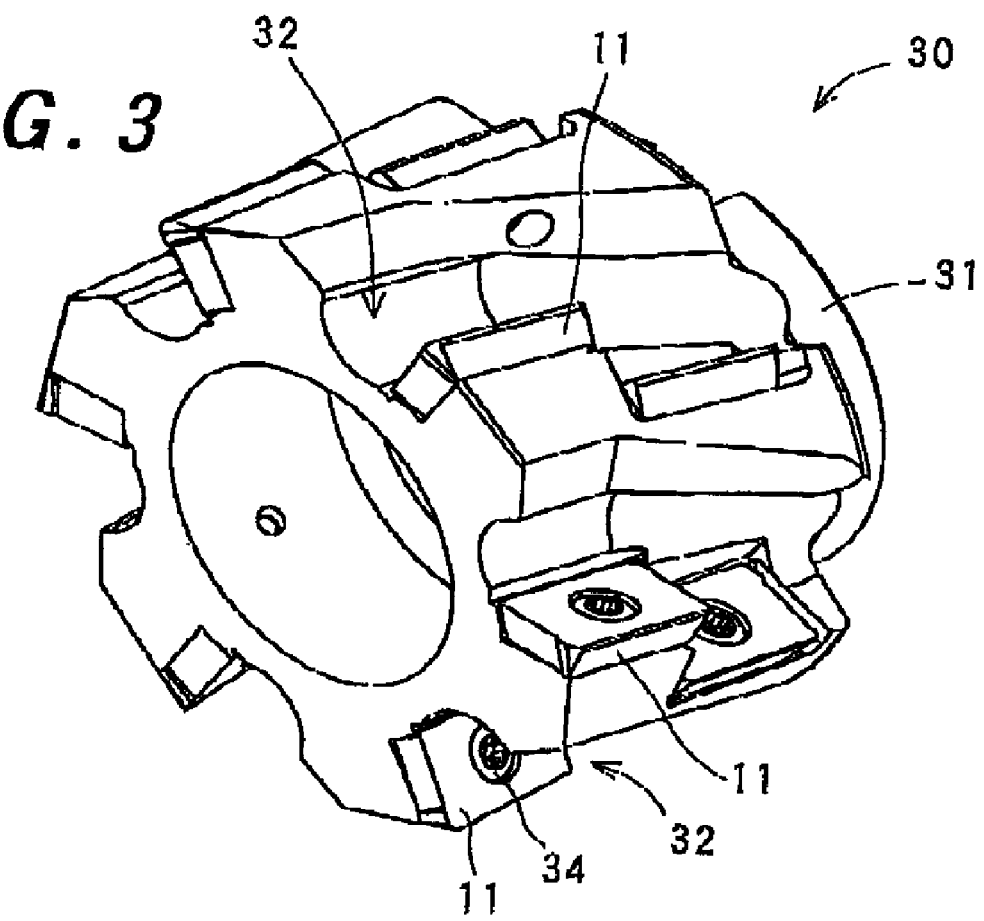
FIG. 3 is a perspective view schematically showing a constitution of a milling tool according to one embodiment of the invention.

FIG. 3 is a perspective view schematically showing a constitution of a milling tool 30 according to one embodiment of the invention. The milling tool 30 includes the insert 11 and a holder 31 for use in a milling tool (hereinafter referred to as "a holder 31"). The insert 11 is shown in FIG. 2. The holder 31 has a schematic column shape. An outer periphery of the holder 31 are provided with a mount on which the insert 11 is detachably formed, and a cutting pocket 32 formed so as to be adjacent to the mount. The insert 11 is placed on the mount so that the major cutting edge 15 is disposed on the outer periphery side with the rake face 12 exposed in a rotational direction of the milling tool 30, and then fixed on the holder 31 by use of clamp means 34 such as a screw body.

(Production Method)

An example of the method for producing the surface-coated body of the invention will be described.

First, an inorganic powder capable of forming the base body 2 by sintering such as metal carbide, nitride, carbonitride or oxide is suitably added and mixed with metal powder, carbon powder or the like, which are then molded to a predetermined tool shape by a publicly known molding method such as press molding, cast molding, extrusion molding or cold isostatic press molding. After that, the molded body is sintered in vacuum or a non-oxidizing atmosphere to give the base body 2 composed of aforementioned hard alloy. Here, of course the base body 2 may be composed of metal or alloy. The surface of the base body 2 is subjected to a combined processing of: a polishing processing such as honing of the cutting edge portion, wrapping, buffing, polishing and barreling; a machining processing such as a blasting process and grinding process; and a chemical processing such as etching with acid or alkali, electrolytic machining and heat treatment, according to need.

Then, on the surface of the base body 2, the hard film 3 is formed using, for example, the ion plating method. The condition of forming the hard film 3 may be suitably set in accordance with materials constituting the hard film 3. For example, basic conditions for forming a (Ti, Al)N film may be controlled so as to be 1-5 Pa of gas pressure, 10-300 V, preferably 20-300 V of bias voltage, and temperature of 500-600° C. in coating.

Particularly, in the invention, it is preferred that the bias voltage in the film forming is determined to 10-50 V, preferably 20-50 V only for around initial 1 minute, then the bias voltage value is gradually increased and the bias voltage is varied to 150-300 V. Hereby, the inert gas content in the hard film 3 can be controlled in a predetermined range, and it is possible to make the intensity of the peak caused by the (111) plane of the crystal maximum among peaks detected by the X ray diffraction method of the hard film 3.

By gradually altering the bias voltage in the film forming from a low voltage to a high voltage, the amount of the inert gas existing in the hard film can be controlled. In this case, the inert gas content gradually increases from the interface of the hard film and the base body toward the surface of the film.

As to a reaction gas to be introduced in the film forming, in particular, it is desirable to use a mixed gas of nitrogen and inert gas in which they are mixed so that the flow rate ratio of the nitrogen and inert gas, that is, nitrogen:inert gas becomes 2:1-30:1, preferably 2:1-10:1. By introducing the mixed gas in a vacuum chamber in which plasma has been generated, the inert gas can be stably contained in the hard film. When a plurality of inert gasses are used, the ratio of the nitrogen flow rate to the total flow rate of the inert gasses is adjusted to the above ratio. When the nitrogen rate is in the range of flow rate ratio of nitrogen to inert gas of 2/1 to 30/1, sufficient content of nitrogen gas for producing nitride can be attained. Accordingly the hard film 3 having a uniform thickness is obtained. In addition, appropriate content of the inert gas is also attained. Therefore crystal growth is well controlled through the inert gas.

As to a target to be used, a titanium-aluminum alloy having a composition composed of $(Ti_x, Al_{1-x})$ (wherein x: 0.4-0.7) is desirable.

By using the surface coated body of the invention thus obtained as a cutting tool, and applying a cutting to a work piece, a cut product can be obtained. A grinding method is not particularly limited, and grinding methods that had been publicly known before filing the application through Patent Gazettes, documents, books, journals, disclosure of techniques, Internet and conference presentations can be applied, except fur using the surface-coated body of the invention as a cutting tool. For example, a cutting method including an abutting step, a cutting step and an evacuation step can be mentioned. In the abutting step, the hard film (cutting edge portion) of the surface-coated body of the invention is abutted to a portion to be cut of a fixed material. In the cutting step, the surface coated body of the invention is slid against the portion to be cut of the material to effect cutting. In the evacuation step, the hard film of the surface-coated body of the invention is detached from the to-be-cut portion of the material, and the material is unloaded. The work piece is, for example, metal, ceramics, or synthetic resin. The use of the surface-coated body of the invention as a cutting tool can give products having high dimensional accuracy and work piece exactly duplicating a set work piece. Specific examples of the cut product include an automobile component, a construction and machinery component, a machine tool component, a precision machinery component, and an aircraft component.

Figure 4:
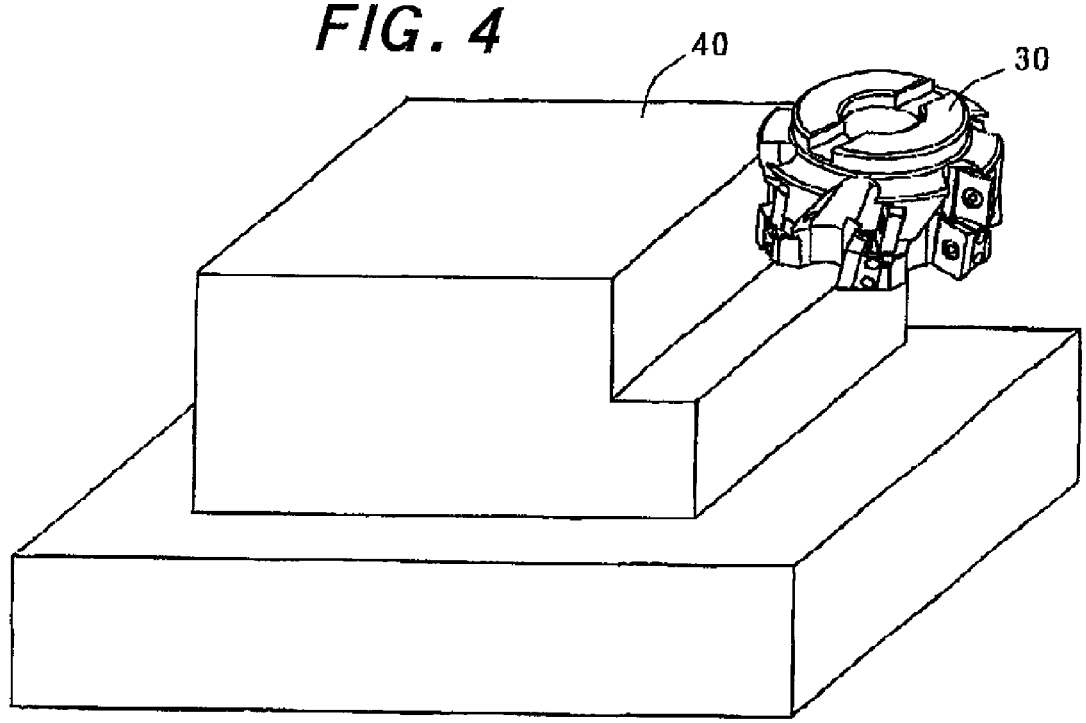
FIG. 4 is a schematic view showing a situation of a cutting through the milling tool according to one embodiment of the invention.

A specific example of using the surface-coated body of the invention as a cutting tool is shown in FIG. 4. FIG. 4 is a schematic view showing a situation of a cutting through the milling tool according to one embodiment of the invention. The milling tool shown in FIG. 4 is the milling tool 30 shown in FIG. 3. The milling tool 30 is mounted on a machine tool such as a machining center (not shown). As shown in FIG. 4, the milling tool 30 is made to rotate and while doing so, brought to a side face of a work piece 40 so as to come into contact therewith so that the major cutting edge 15 repeatedly cuts into the work piece 40. A shoulder milling and the like process are thus conducted.

The cutting tool according to one embodiment of the invention has excellent wear resistance and fracture resistance, so that long time machining is possible. Accordingly, an intermittent machining process is possible in which the cutting tool is brought into contact with the work piece to cut the work piece while at least one of the cutting tool and the work piece is rotated for a predetermined length of time, thereafter rotation thereof is stopped once, and then the cutting tool is brought into contact with the work piece to cut the work piece while at least one of the cutting tool and the work piece is further rotated for a predetermined length of time. Therefore, it is possible to manufacture a product of high machining accuracy.

The cutting edge of the cutting tool and the work piece may be brought into contact with each other while the cutting tool and the work piece are relatively rotated. Therefore, the work piece may be brought into contact with the cutting edge of the cutting tool while the work piece is rotated.

In this connection, in the embodiments, the case where the invention is applied to cutting tools is described. But the surface-coated body of the invention is not limited to above embodiments and can be applied to various applications where wear resistance, fracture resistance, sliding properties and the like are required. Further, in the invention, the hard film to be coated on the surface of a base body may be coated on the whole base body, or may be coated on only a part of the base body where wear resistance, fracture resistance, sliding properties and the like are required.

EXAMPLES

Examples 1-6 and Comparative Examples 1-4

87% by mass of WC powder having an average grain size of 0.7 μm, 10% by mass of Co powder, 2% by mass of TiC powder and 1% by mass of NbC powder were crushed and mixed. The resulting mixed powder was molded into a CNMA120408 shape by press molding, which was sintered in a vacuum atmosphere to manufacture a cemented carbide base body. The obtained cemented carbide base body was set in a cathode arc type ion plating apparatus (trade name: Arc Ion Plating apparatus, manufactured by Kobe Steel, Ltd.). On the base body was formed a hard film composed of a composition of (Ti, Al)N in a thickness of 2 μm in such conditions as base body temperature of 500° C., arc steady current of 150 A while varying the arc current according to conditions shown in Table 1, thereby giving a throwaway chip. The application time in Table 1 was determined to constant, that is, 1 minute for the initial bias voltage and 20 minutes for the steady state bias voltage.

TABLE 1

|  | Bias voltage | | | Gas pressure | | Nitrogen:Inert gas flow rate ratio |
| --- | --- | --- | --- | --- | --- | --- |
|  | Initial | Steady state | Altering speed | (Pa) | Inert gas |  |
| Example 1 | 15 V | 150 V | 30 V/min | 6 | Ar | 2:1 |
| Example 2 | 10 V | 200 V | 50 V/min | 3 | Kr | 10:1 |
| Example 3 | 30 V | 200 V | 25 V/min | 5 | Ar, Xe | 30:1 |
| Example 4 | 15 V | 100 V | Instantaneous switching | 6 | Xe, Ne | 5:1 |
| Example 5 | 15 V | 250 V | 30 V/min | 1 | Kr, He | 4:1 |
| Example 6 | 15 V | 300 V | 50 V/min | 3 | Ar, Kr, Ne, He | 13:1 |
| Comp. Ex. 1 | 30 V | 30 V | — | 5 | — | — |
| Comp. Ex. 2 | 15 V | 150 V | 25 V/min | 5 | Ar | 1:1 |
| Comp. Ex. 3 | 100 V | 100 V | — | 5 | Xe, He | 50:1 |
| Comp. Ex. 4 | 15 V | 100 V | Instantaneous switching | 5 | Ar, Xe | 50:1 |

The throwaway chips obtained in Examples 1-6 and Comparative Examples 1-4 were cut off and, for the hard film of the cross-section near the cutting edge of each of the throwaway chips, a contained inert gas amount was determine the quantity with an analysis apparatus of the WDS (wave dispersion) system using the EPMA method. The results are shown in Table 2. Further, the inert gas amount X in the inside position from the surface in 10% of the film thickness and the inert gas amount Y in the inside position from the interface of the base body and the hard film in 10% of the film thickness were measured with the micro-AES, to calculate the ratio of the inert gas amount X/Y. At the same time, it was checked whether or not the hard film had such sloping composition that the inert gas content gradually decreases from the inside position from the interface of the hard film and the base body by a thickness corresponding to 10% of the hard film toward the interface of the hard film and the base body. Note that the measurement through the AES is conducted by irradiating respectively with an electron beam of 20 nm, under high vacuum, the inside position from the surface in 10% of the film thickness and the inside position from the interface of the base body and the hard film in 10% of the film thickness, and then the elemental composition several nanometers away from the surface is measured. The results are shown in Table 2. It is also possible to measure an element distribution profile toward the depth direction by using GDS (GD-OES; radio-frequency glow discharge optical emission surface analyzer) or the like.

Furthermore, the rake face of the throwaway chip was subjected to X-ray diffraction analysis (XRD) to check detected peaks of the hard film. From the detected results, the value A/B, wherein A is intensity of the peak showing the (111) plane and B is intensity of the peak showing (200) plane, was obtained. The results are shown in Table 2.

TABLE 2

|  |  |  | EPMA analysis | | | | XRD | | |
| --- | --- | --- | --- | --- | --- | --- | --- | --- | --- |
|  |  |  | Detected inert gas element intensity | Content Weight % | X/Y | Distribution of inert gas | Crystal plane exhibiting strongest intensity | Crystal plane exhibiting 2nd-strongest intensity | A/H |
| Example | 1 | | Ar | 0.1 | 0.8 | Sloping composition | (111) | (200) | 1.5 |
|  | 2 | | Kr | 0.08 | 0.5 | Sloping composition | (111) | (200) | 2.2 |
|  | 3 | | Ar, Xe | 0.05 | 0.6 | Sloping composition | (111) | (200) | 2.3 |
|  | 4 | | Xe, Ne | 0.25 | 1.3 | No cloping | (111) | (200) | 1.9 |
|  | 5 | | Kr, He | 0.03 | 1 | Sloping composition | (111) | (200) | 1.2 |
|  | 6 | | Ar, Kr, Ne, He | 0.1 | 1.5 | Sloping composition | (111) | (200) | 3.0 |
| Comp. Example | 1 | | — | — | — | — | (200) | (111) | 0.3 |
|  | 2 | | Ar | 5.5 | 0.3 | Sloping composition | (200) | (111) | — |
|  | 3 | | Xe, He | — | — | — | (111) | (200) | 1.3 |
|  | 4 | | Ar, Xe | 0.1 | 1.9 | No sloping | (200) | (111) | — |

Using the obtained chips, cutting test was carried out in the following conditions. The results are shown in Table 3.

(Wear Test)
<Cutting Condition>
Cutting method: turning cutting
Work piece: S45C
Cutting speed: 250 m/min
Feed: 0.4 mm/rev
Depth of cut: 2 mm
Cutting condition: dry cutting
Evaluation method: measurement of flank wear and nose wear upon cutting for 10 minutes (Interrupt Evaluation)
<Cutting Condition>
Cutting method: turning cutting
Work piece: S35C with 4 grooves
Cutting speed: 200 m/min
Feed: 0.4 m/rev
Depth of cut: 2 mm
Cutting situation: wet system
Evaluation method: measurement of impact numbers by the groove of the work piece upon fracture of the cutting edge
The state of the cutting edge when 1000 times of impact were applied was checked.

TABLE 3

| | Wear resistance test wear amount (mm) | | Fracture resistance test impact number lead to fracture (times) | State of hard layer |
|---|---|---|---|---|
| | Flank wear | End wear | | |
| Example 1 | 0.10 | 0.10 | 4900 | Test OK |
| Example 2 | 0.16 | 0.17 | 5000 | Test OK |
| Example 3 | 0.16 | 0.16 | 4500 | Test OK |
| Example 4 | 0.14 | 0.18 | 3800 | Test OK |
| Example 5 | 0.12 | 0.13 | 6000 | Test OK |
| Example 6 | 0.16 | 0.14 | 5300 | Test OK |
| Comp. Ex. 1 | 0.25 | 0.26 | 1400 | Film detached |
| Comp. Ex. 2 | 0.23 | 0.23 | 2600 | Chipping |
| Comp. Ex. 3 | 0.3 | 0.32 | 1200 | Film detached |
| Comp. Ex. 4 | 0.33 | 0.36 | 3300 | Micro chipping |

From Tables 2 and 3, it was found that, samples in Comparative Examples 1 and 2 from which no inert gas element was detected in the hard film showed detachment of the hard film at early stages and fracture due to chipping or the like.

On the other hand, the sample in Comparative Example 2 containing excess inert gas element in the hard film had both poor wear resistance and poor fracture resistance.

Further, the sample in Comparative Example 4 from which the inert gas element was detected in the hard film but whose peak of the highest intensity was not caused by the (111) plane had poor wear resistance and short tool lifetime.

On the contrary, sample Nos. 1-6 in the range of the invention, that is, which contain one or more inert gas elements (He, Ne, Ar, Xe, Kr, Rn) in 0.01% by mass 1% by mass and have the peak of the highest intensity caused by the (111) plane of the crystal among peaks detected with the X-ray diffraction method, did not show occurrence of chipping and film exfoliation in the hard film and had high wear resistance, to constitute tools with very long lifetime.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A wear-resistant structure comprising:
   a base body; and
   a film formed on the base body,
   wherein the film contains one or more selected from nitride, nitrooxide, carbonitride, and carbonitrooxide that contain at least titanium, and 0.01-1% by mass of one or more selected from He, Ne, Ar, Xe, Kr and Rn based on a total mass of the film,
   wherein the film shows a maximum intensity at a peak caused by a (111) plane of a crystal among peaks detected by an X-ray diffraction method, and
   wherein a content of the inert gas gradually decreases from a position which is interior from an interface of the film and the base body by a thickness corresponding to 10% of a thickness of the film toward the interface of the film and the base body.

2. The wear-resistant structure of claim 1, wherein a peak of the film caused by a (200) plane of the crystal has a second-highest intensity among peaks detected with the X-ray diffraction method.

3. The wear-resistant structure of claim 2, wherein an intensity A of the peak caused by the (111) plane and an intensity B of the peak caused by the (200) plane have a relation of $1.1 < (A/B) < 10.0$.

4. The wear-resistant structure of claim 1, wherein the film contains at least one of Ar and Kr.

5. The wear-resistant structure of claim 4, wherein the film contains at least one of He and Ne together with at least one of Ar and Kr.

6. The wear-resistant structure of claim 1, wherein a ratio X/Y is from 0.5 to 1.5,
   wherein X is an amount of the inert gas in a position which is interior from a surface of the film by a thickness corresponding to 10% of a thickness of the film, and Y is an amount of the inert gas in a position which is interior from an interface of the film and the base body by a thickness corresponding to 10% of the thickness of the film.

7. The wear-resistant structure of claim 1, wherein the film further contains Al.

* * * * *